United States Patent
Yanagawa et al.

(10) Patent No.: US 6,311,016 B1
(45) Date of Patent: Oct. 30, 2001

(54) SUBSTRATE TEMPERATURE MEASURING APPARATUS, SUBSTRATE TEMPERATURE MEASURING METHOD, SUBSTRATE HEATING METHOD AND HEAT TREATMENT APPARATUS

(75) Inventors: Syusaku Yanagawa, Kanagawa (JP); Werner Blersch, Dornstadt (DE)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/171,786
(22) PCT Filed: Feb. 26, 1998
(86) PCT No.: PCT/JP98/00779
  § 371 Date: May 7, 1999
  § 102(e) Date: May 7, 1999
(87) PCT Pub. No.: WO98/38673
  PCT Pub. Date: Sep. 3, 1998

(30) Foreign Application Priority Data

Feb. 27, 1997 (JP) .................................................. 9-043166

(51) Int. Cl.⁷ ....................................................... A21B 2/00
(52) U.S. Cl. ........................... 392/416; 219/390; 118/724
(58) Field of Search ..................................... 219/390, 405, 219/411; 392/416, 418; 118/724, 725, 50.1; 374/179; 250/492.2, 492.22, 492.23

(56) References Cited

U.S. PATENT DOCUMENTS 5,315,092 * 5/1994 Takahashi et al. .................... 219/497
5,567,909 * 10/1996 Sugarman et al. .................... 136/201
5,710,407 * 1/1998 Moore et al. ......................... 219/405

* cited by examiner

Primary Examiner—Teresa Walberg
Assistant Examiner—Shawntina Fuqua
(74) Attorney, Agent, or Firm—Ronald P. Kananen; Rader, Fishman & Grauer

(57) ABSTRACT

A temperature measuring apparatus, for measuring a temperature of a substrate in a heating apparatus heating a substrate by irradiation of light, and a method for measuring a substrate temperature, the measuring apparatus having a thermocouple and a covering member for covering it. The covering member portion covering the thermocouple is made of a material with a high heat conductivity and its excluding the material with a high heat conductivity portion is made of a material with a high light reflection factor respectively, whereby it is possible to accurately measure the temperature of the substrate heated by irradiation light without the measurement being affected by the heating irradiation light and without contaminating the substrate and further, without depending on film thicknesses structure of the substrate.

28 Claims, 11 Drawing Sheets (1)

(2)

(3)

SUBSTRATE TEMPERATURE MEASURING APPARATUS, SUBSTRATE TEMPERATURE MEASURING METHOD, SUBSTRATE HEATING METHOD AND HEAT TREATMENT APPARATUS

TECHNICAL FIELD

This invention relates to a substrate temperature measuring apparatus, a substrate temperature measuring method, a substrate heating method and a heating method apparatus.

BACKGROUND ART

In recent years, as semiconductor devices become minute, it becomes necessary to form shallow junctions with high precision, for MOS devices to restrain a short channel effect and for bipolar devices to improve their cutoff frequency fT. One method of forming a shallow junction is a heating method (RTA: Rapid Thermal Annealing) by light irradiation, which is capable of treating a device at a high temperature and for a short time, is employed. Also, the RTA is used for eliminating crystal defects which occur as a result of ion implantation, for various kinds of annealing such as a sinter and the like, and for forming an oxidized film and a nitrificated film. Therefore, it has become very important to accurately control a substrate temperature of a substrate having various film structures, a substrate having various impurity concentrations, and the like.

However, when the substrate heating method employs light irradiation, there are changes in emissivity of a substrate which are dependent on film structure, film quality, impurity concentration, and the like. This results in changes in the quantity of light absorbed (treatment temperature) by the substrate under circumstances where irradiation intensity is constant. Therefore, as a manufacturing process becomes more complex, it is very difficult to control the heated state of a substrate which contains, variations (dispersion of film thickness, film quality, the amount of impurity, structure and the like). Further, the temperature of the substrate changes depending on a change in the light transmission factor of the quartz tube which is employed as the heating apparatus, a change in a reflection factor of the inside wall of the chamber, and a change in the lamp output in terms of time and the like. In order to cope with this problem, closed loop control is under discussion which measures the substrate temperature and feeds back the measured value to control the lamp output is under discussion.

Also, one apparatus for measuring the substrate temperature, there is a radiation thermometer. This radiation thermometer has an advantage in that it can carry out the temperature measurement of the substrate without coming in contact therewith.

Another temperature measuring apparatus is a thermocouple. When the temperature measurement is carried out by a thermocouple, there are methods to get the thermocouple in direct contact with a surface of the substrate and to fix the thermocouple on the surface of the substrate by using a thermally stabilized adhesive, and so on. These methods have advantage in that when the temperature measuring portion (alloy portion) of the thermocouple comes in direct contact with the substrate it is possible to accurately measure the substrate temperature.

As for other temperature measuring apparatuses, an apparatus is disclosed in a Japanese patent application No 4148546 public bulletin, wherein the substrate temperature is indirectly measured by inserting the thermocouple into a covering member made of silicon carbide (SiC).

Temperature measurements made by using the above-mentioned radiation thermometer are different from the contact-type heat measuring method using thermocouples in that its measuring accuracy depends on the surface state of the object to be measured and hence, is strongly influenced by a measuring environment. With substrates having various film structures and impurity concentrations, there is different emissivity for every substrate. Accordingly, as there is a need to first obtain the emissivity of each substrate in order to carry out an accurate measurement.

Also, with the method for measuring substrate temperature by getting the thermocouple in direct contact with the substrate, problems occur with the deterioration in the thermocouple due to a reaction between the substrate and the thermocouple, metal contamination of the substrate, and the like.

Furthermore, with the method for measuring the temperature by inserting the thermocouple into the covering member, a problem of the metal contamination of the substrate by the thermoelectric couple is solved. However, the thermocouple is measuring the temperature of the covering member. Also, in a process wherein the substrate is subjected to heating by light irradiation heating apparatus, when the substrate temperature rises, the covering member is heated not only by thermal conduction, but by directly absorbing the irradiated light. As a result, the accurate measurement of the substrate temperature becomes difficult.

Also, the heat conduction from the substrate, absorption of radiation from the substrate by the covering member, and absorption of the irradiated lamp light differ depending on materials used for the covering member. Quartz and silicon carbide are shown as examples. When the quarts is used for the covering member, the light absorption can be restrained, but because the quartz has body heat conduction, the measurement of the substrate temperature is difficult and its thermal responsiveness deteriorates. On the other hand, when silicon carbide is used for the covering member, it excels in conducting substrate, heat but, because it absorbs a great deal of light, the measured temperature depends greatly on the light irradiation intensity. Due to these thermal characteristics, each of the materials has advantages as well as a drawback.

Another method to increase thermal conduction efficiency from the substrate employs machining the covering member flat at a contact portion between the covering member and the substrate, where two surfaces are in contact with each other, but this method leads to increasing the thermal capacity of the covering member. As a result, there is increased heating due to the direct absorption of light, thereby making it impossible to accurately measure the substrate temperature.

Where closed loop control is used to vary light irradiation intensity, the amount of heat absorbed by the covering changes depending on the irradiation intensity it is, therefore, impossible to accurately measure changes in the light absorption quantity (substrate temperature) due to changes in the irradiation factor of the substrate which has various kinds of film structures and impurity concentration. Furthermore, in the case of a sheath-type thermocouple, because a portion of the thermocouple, other than a point where the temperature is measured is heated, there is a concern that a high temperature region will occur in an middle region with respect to the "temperature measuring point", thereby inviting a shunt error, which drops the accuracy of the measurement.

DISCLOSURE OF THE INVENTION

The present invention provides a substrate temperature measuring apparatus, a substrate temperature measuring method, a substrate heating method and a heating method apparatus with a view to solving the above-mentioned problems.

The substrate temperature measuring apparatus is equipped with a temperature measuring means and a covering member and the temperature measuring means measures the temperature of a substrate which is heated by light irradiation by contacting a temperature measuring portion of the temperature measuring means to the substrate through the covering member. A portion in the covering member that covers the measuring portion is made of a material having high heat conductivity. The other portion of the covering member which does not cover the measuring portion, consists of a material having high heat conductivity and is made of either a material having a high light transmittance factor or a material having a high light reflection factor.

In the above-mentioned temperature measuring apparatus, because the portion of the covering member covering the temperature measuring portion of the temperature measuring apparatus is made of a material with high heat conductivity, the substrate temperature tends to easily conduct to the temperature measuring portion. As a result, although it is a measurement of the temperature through the covering member, it becomes possible to measure the substrate temperature. Also, because the portion of the covering member not covering the measuring portion is made of a material having high heat conductivity with a high light transmission factor or material with the high reflection factor, the covering material covering the temperature measuring means never absorbs the light when subjected to the light irradiation in the midst of measuring. As a result, because there is scarcely any rise in the temperature of the covering member due to light irradiation, a change in a measured temperature value by the temperature measuring means due to the absorption of the covering member and a change in a measured temperature by radiation from the substrate almost never occurs.

A method for measuring the substrate temperature employs the above-described temperature measuring means and the covering member for covering it, for measuring the temperature of the substrate. The substrate is heated by light irradiation with the substrate temperature being measured by having the measuring portion of the temperature measuring means in contact with the substrate through the covering member.

Because the temperature of the substrate is measured by the covering member which is made of a material with a high heat conductivity, the temperature of the substrate is easily conducted to the heat-measuring unit by the covering member. As a result, although it is the measurement of the temperature of the covering member, it becomes possible to accurately measure the substrate temperature. Because a portion of the covering member is made of either a material having a high light transmittance factor or a material having a high light reflecting factor, the covering material almost never absorbs light when subjected to the light irradiation in the midst of measuring. As a result, because there is scarcely any rise in the temperature of the covering member due to the light irradiation, a change in a measured temperature value by the temperature measuring means due to heat absorption of the covering member and a change in a measured temperature by the radiation from the substrate almost never occurs.

A method for heating a substrate by way of light irradiation is a method wherein the light irradiation is conducted by raising an irradiation intensity of a light which is irradiated upon a substrate surface on the opposite side of a substrate from with which the temperature measuring portion of the temperature measuring apparatus for measuring the substrate temperature is in contact.

In the above-mentioned method for heating the substrate, the intensity of the light irradiated on the substrate surface on the side with which the temperature measuring portion is in contact is weakened, i.e., a quantity of the light irradiated on the temperature measuring portion becomes smaller. As a result, an effect on the temperature measuring portion by the light irradiation becomes less and measurement errors of the substrate temperature are reduced.

A heating method apparatus is equipped with a heating light source by way of the light irradiation, a member to be irradiated by the light from the heating light source, a temperature measuring portion for measuring the temperature of the heated member, a first temperature measuring portion covering member which is provided at one end of the temperature measuring portion and made of the material having high heat conductivity, and a second temperature measuring portion covering member which covers a periphery of the temperature measuring portion and is made of a material having a high light transmission factor.

In the above-mentioned heating method apparatus with covering members, as the first temperature measuring portion covering member for covering the temperature measuring portion is made of the material having high heat conductivity, the substrate temperature tends to easily conduct to the temperature measuring portion. For that reason, although it is the measurement of the temperature through the first temperature measuring portion covering member, it becomes possible to measure the substrate temperature. Also, because the second temperature measuring portion covering member is made of a material having high heat conductivity and with a high light transmission factor or a material with a high light reflection factor, when this portion is subjected to the light irradiation, it almost never absorbs the light. As a result, because there is scarcely any rise in the temperature of the covering member due to the light irradiation, a change in a measured temperature value by the temperature measuring means due to the absorption of the covering member and a change in a measured temperature by radiation from the substrate, almost never occurs.

BEST MODE FOR CARRYING OUT THE INVENTION

One example of a first embodiment of the present invention will be described with reference to the schematic structural cross-sectional block of FIG. 1.

Figure 1:
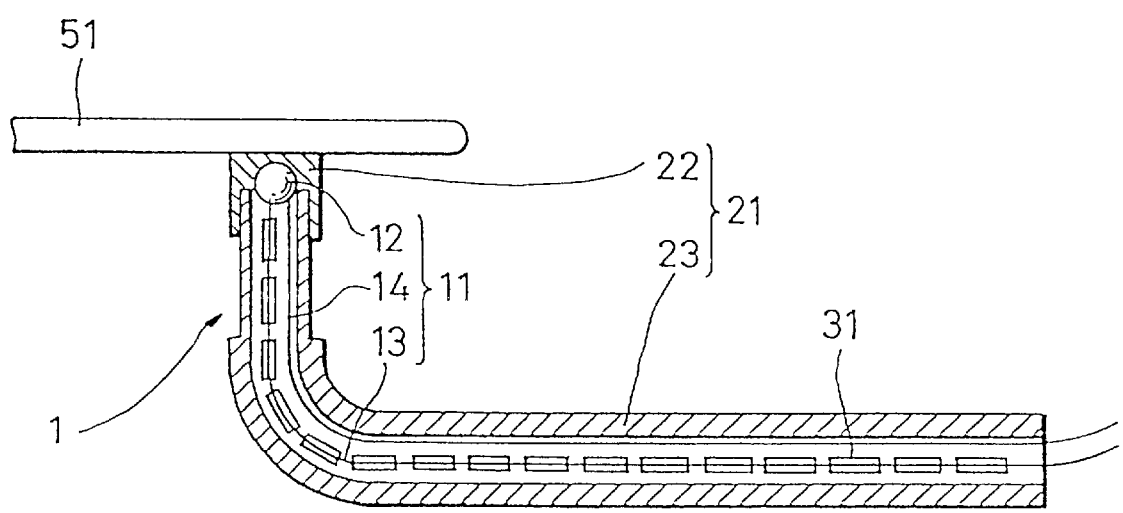
FIG. 1 is a schematic structural cross-sectional diagram of a first embodiment of the invention in connection with a temperature measuring apparatus of the present invention.

In FIG. 1, a cross-sectional view of a temperature measuring apparatus 1 for a substrate is shown together with the substrate.

The temperature measuring apparatus 1 has such a structure wherein a thermocouple 11 is used as a temperature measuring means and the thermocouple 11 is covered with a covering member 21. A voltmeter (not shown)is connected to the above-mentioned thermocouple 11 for measuring an electromotive force of the thermocouple 11.

The above-mentioned thermocouple 11 is made of, for example, platinum (Pt), platinum (Pt)0.10%rhodium (Rh) and a temperature measuring portion (alloy portion) 12 of the thermoe formed of an alloy of a platinum wire and platinum0.10%rhodium wire.

Also, an insulation tube 31 is loosely inserted into at least either wire and the insulation tube 31 is made of, for example, quartz. In this example, the insulation tube 31 is loosely inserted into a platinum conductor wire 13. Naturally, it may be possible that insulation tube 31 may be loosely inserted into a platinum0.10%rhodium wire 14.

Of the above-mentioned covering member 21, a first temperature measuring portion covering member 22 is made of a material having high heat conductivity and in substantial contact with the temperature measuring portion 12. This temperature measuring portion covering member 22 is made of, for example, a material which has about ten times the heat conductivity as that of quartz (heat conductivity= 1.66.m-1.K-1), and preferably of a material having a heat conductivity more than 100W.m-1.K-1. One such material is silicon carbide (heat conductivty=261 W.m-1.k-1).

In this manner, because the temperature measuring portion covering member 22 is in substantial contact with the temperature measuring portion 12 and is made of silicon carbide, heat from substrate 51 sufficiently conducts to the temperature measuring portion 12.

Further, the temperature measuring portion covering member 22 has such a structure that its surface area is made small in order to restrain direct absorption of the light to the utmost and its heat capacity is made small to raise heat responsiveness. That is, the contour of the temperature measuring portion covering member 22 is shaped like a cap relative to the temperature measuring portion 12 and has dimensions of 1.4 mm in cap's outer diameter, 0.9 mm in cap's inner diameter and 1.4 mm in cap's height.

Also, a second temperature measuring portion covering member 23 of the above-mentioned covering member 21 is. a wire portion covering member and is made of quartz. The quartz excels in penetration property for infrared rays and is formed into a tube shape having a circular cross-section to substantially suppress the direct absorption of light.

The substrate 51 is horizontally supported by the temperature measuring portion covering member 22, which is the foremost end portion of the above-mentioned temperature measuring apparatus 1, together with plurality (for example, 2 pieces) of substrate supporting portions (diagrammatic showing is omitted) made of quartz, which project from a quartz tray (diagrammatic showing is omitted).

The thermocouple measuring means of the above-mentioned temperature measuring apparatus 1 is covered with the covering member 21, and of the covering member 21, as the temperature measuring portion because covering member 22 in a portion covering the temperature measuring portion 12 of the thermocouple 11 is formed of a material having high heat conductive property, it becomes easy for the heat of the substrate 51 to conduct to the temperature measuring portion 12. As a result, although measurement of the temperature through the temperature is measuring portion covering member 22, it is effectively a measurement of the substrate temperature 51.

Also, as the wire portion covering member 23 is made of quartz having a high light transmission factor, the wire portion covering member 23 absorbs essentially no light when it is subjected to light irradiation. As a result, because there is scarcely any rise in the temperature of wire portion covering member 23 due to light irradiation, any change in the measured value by the thermocouple 11 due to absorption of heat by the lined portion covering member 23 scarcely occurs.

Meanwhile, each of surfaces of conductor wires 13 and 14 of thermocouple 11 are generally formed to easily reflect light. As a result, when thermocouple 11 is irradiated, it is rarely influenced by the irradiating light.

Furthermore, because the above-mentioned temperature measuring portion covering member 22 is made of silicon carbide, which has a high thermal resistance and is thermally stable under a typical heating method temperature (below 12000 C.) for the normal substrate, the substrate 51 is never contaminated by portion covering member 22 at a time of the heating.

One example of a light irradiation-type heating method apparatus using the temperature measuring apparatus 1 will be described with reference to the schematic structural cross-sectional diagram in FIG. 2.

Figure 2:
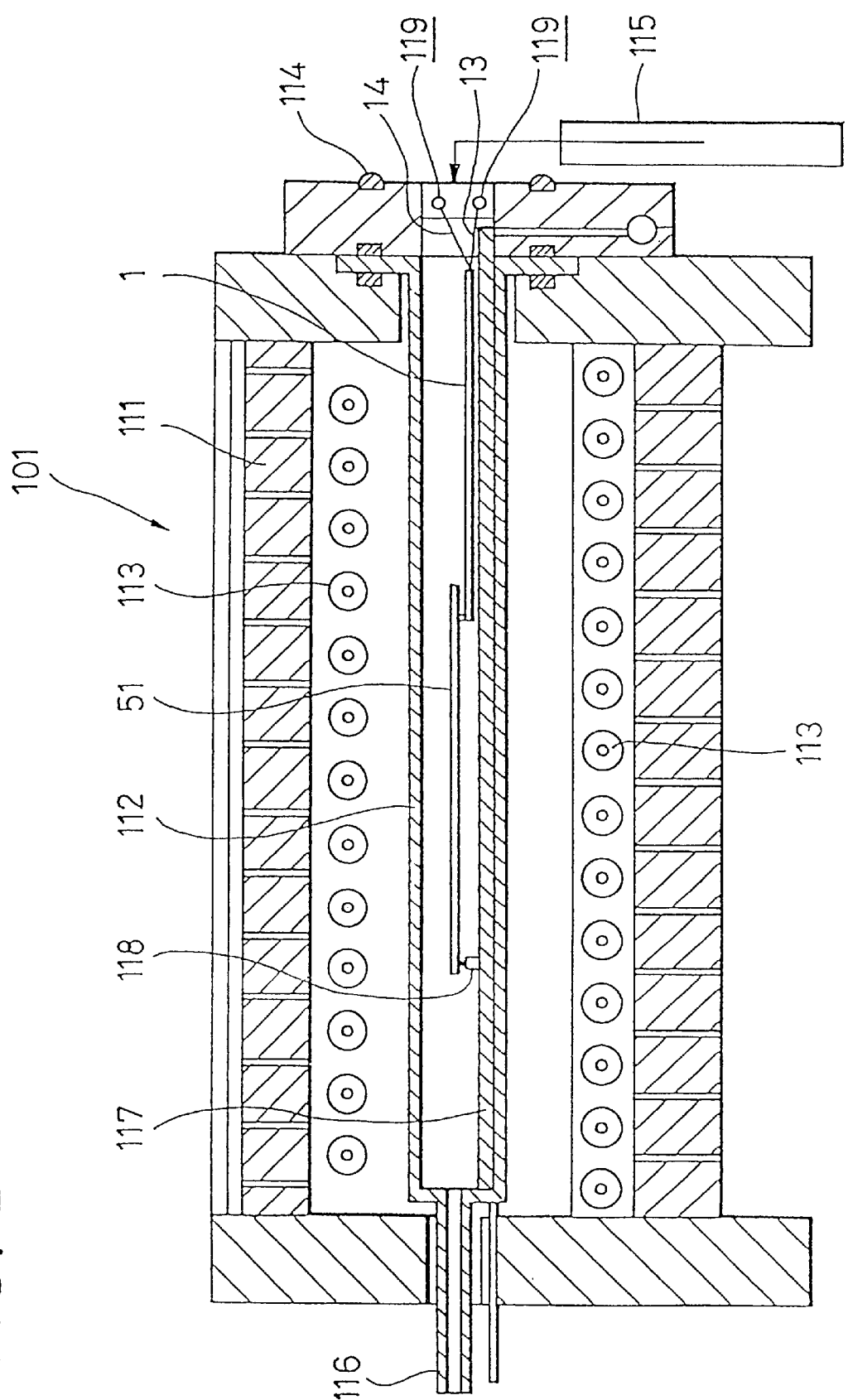
FIG. 2 is a schematic structural cross-sectional diagram of one example of a light irradiation-type heating method apparatus using the temperature measuring apparatus.

As shown in FIG. 2, located inside a reaction furnace 111, is a tube 112, which is made of quartz glass having a high light transmission property for infrared rays, and a halogen lamp 113 for heating. The halogen lamp surrounds the outside periphery of the tube 112. On one end of the reaction furnace 111 containing one end of tube 112, a door 115 is installed which is opened or closed at a time when the substrate 51 is put in or pulled out and is fitted with packing 114 (for example, resinous packing) capable of making the inside of the tube 112 air tight when the inside of the above-mentioned tube 112 is sealed.

A gas introducing tube 116 is connected to the other end of the above-mentioned tube 112 to introduce gas thereinto. Inside the above-mentioned tube 112 is placed a tray 117 made of quartz for supporting the substrate 51. On the tray 117 is formed a substrate supporting portion 118 made of quartz. The substrate 51 is also supported by the foremost end portion (that is, the temperature measuring portion 12 through the temperature measuring portion covering member 22 which was explained in the above-mentioned FIG. 1) of the temperature measuring apparatus 1 arranged on the tray 117 together with the substrate supporting portion 118. Also, the conductor wires 13 and 14 of the thermocouple 11 of the temperature measuring apparatus 1 are led out through apertures 119 provided in an edge portion of the reaction furnace 111.

The light irradiation-type heating method apparatus 101 is structured as mentioned above.

Structures of three kinds of the evaluation samples for measuring the substrate temperature will be described with reference to FIG. 3. Film thickness of each of the evaluation samples are altered to change the emissivity of the substrate.

Figure 3:
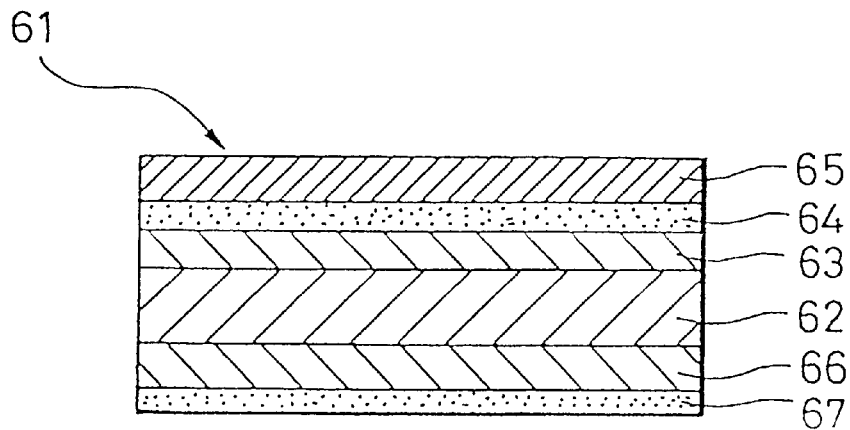
FIG. 3 is a schematic structural cross-sectional diagram of each of evaluation samples.
Figure 3:
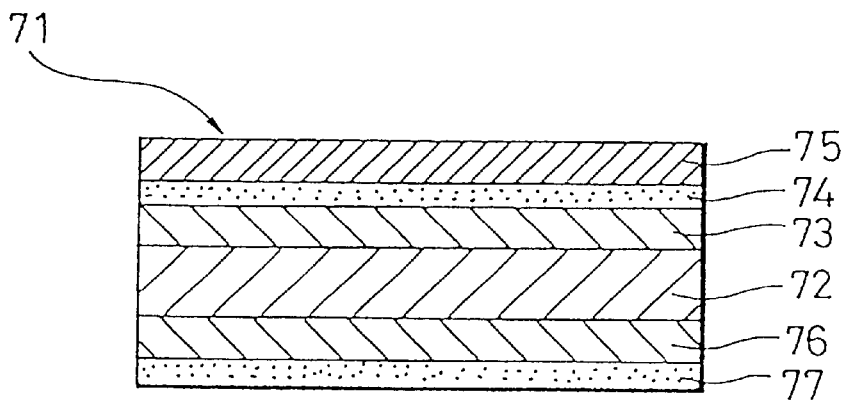
Figure 3:
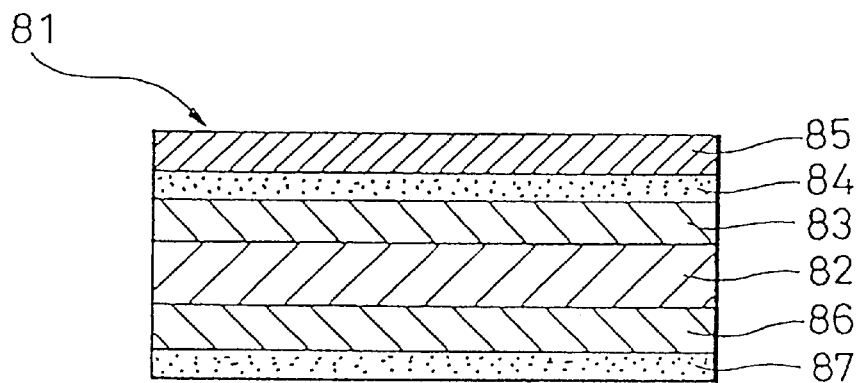

As shown in (1) of FIG. 3, a first evaluation sample 61 is such that on one side (a front surface side) of a silicon substrate 62 are laminated an oxidized silicon film (SiO$_2$) 63, a polycrystal silicon film 64 with a thickness of 150 nm and a capping oxidized silicon film 65 with a thickness of 300 nm, while on other side (rear surface side) of the silicon substrate 62 are laminated an oxidized silicon (SiO$_2$) film 66 and a polycrystal silicon film 67 with a thickness of 150 nm.

Then, the thicknesses of the above-mentioned oxidized silicon films 63 and 66 are altered in a range of 700 nm–900 nm, but a light absorption quantity depends little on the film thickness.

Also, boron difluoride (BF2) is ion-implanted into the polycrystal silicon film 67 where the ion-implantation energy is 40 KeV and the dose amount is $5.4 \times 10^{14}/cm^2$.

As shown in (2) of FIG. 3, a second evaluation sample 71 is such that on one side (front surface side) of a silicon substrate 72 are laminated an oxidized silicon (SiO$_2$) film 73 with a thickness of 800 nm, a polycrystal silicon film 74 with a thickness of 150 nm and a capping oxidized silicon film 75 with a thickness of 300 m, while on another side (rear surface side) of the substrate 72 are laminated an oxidized silicon (SiO$_2$) film 76 with a thickness of 800 nm and A polycrystal silicon film 77.

Then, the thickness of the polycrystal silicon film 77 on the above-mentioned rear side 77 are changed within a range of 150 nm to 350 nm with some variation in light absorption.

Also, boron difluoride (BF2) is ion-implanted into the polycrystal silicon film 74 on the front side where the ion-implantation energy is 40 KeV and the dose amount is $5.4 \times 10^{14}/cm^2$.

As shown in (3) of FIG. 3, a third evaluation sample 81 is such that on one side (front surface side) of a silicon substrate 82 are laminated an oxidized silicon (SiO$_2$) film 83, a polycrystal silicon film 84 with a thickness of 150 nm and a capping oxidized silicon film 85 with a thickness of 300 nm, while on the other side (rear surface side) of the substrate 82 are laminated an oxidized silicon film 86 and a polycrystal silicon film 87 with a thickness of 150 nm.

Thicknesses of the oxidized silicon films 83 and 86 are varied in a range of 100 nm–600 nm in steps of 100 nm, 200 nm, 300 nm, 400 nm and 600 nm. As a result, in the evaluation sample 81, the amount of light absorption by the oxidized silicon films 83 and 86 depends a great deal on the thickness of the film.

Also, boron difluoride (BF2) is ion-implanted into the polycrystal silicon film 84 where the ion-implantation energy is 40 Kev and the dose amount is $5.4 \times 10^{14}/cm^2$.

By directly bonding thermocouples with heat resistance additives respectively to a plurality of the first evaluation samples 61 which have different film thicknesses of the oxidized silicon film 63, to a plurality of the second evaluation samples 71 which have different film thicknesses of the polycrystal silicon film 77 and to a plurality of the third evaluation samples 81 which have different film thicknesses of the oxidized silicon films 83 and 86, correct measurement of the temperatures using the thermocouples is carried out.

Figure 4:
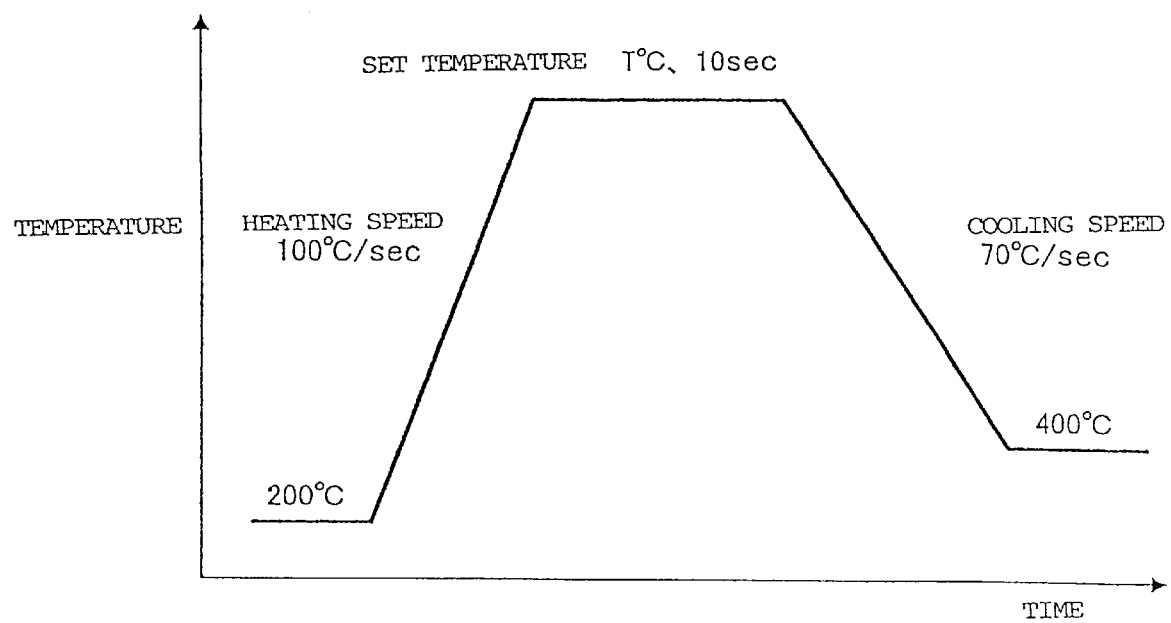
FIG. 4 is an explanatory diagram of a sequence of RTA.

In the measurement of the temperature, the first evaluation sample 61, the second evaluation sample 71 and the 3rd evaluation sample 81 are substituted for the substrate 51, and are subjected to heating by way of a Rapid Thermal Annealing (RTA) process using the light irradiation-type heating method apparatus 101 which is explained in the above-mentioned FIG. 2. Each evaluation sample is put through a sequence of RTA steps is, as shown in FIG. 4. Each evaluation sample is placed in the tube 112 (refer to FIG. 2) wherein the temperature is set at 2000° C. Then, the evaluation sample is heated up to a set temperature T°C. at a heating speed of 100° C./Sec and the down to 4000 C at a cooling speed of 700 C/Sec. Thereafter, the evaluation sample is pulled out from inside of the tube 112.

The above-mentioned set temperatures T of the RTA are set at 900° C., 1000° C., 1050° C., 1100° C. and 1150° C.

The above-mentioned sequence of the RTA is just an example, and is capable of being changed according to circumstances.

Figure 5:
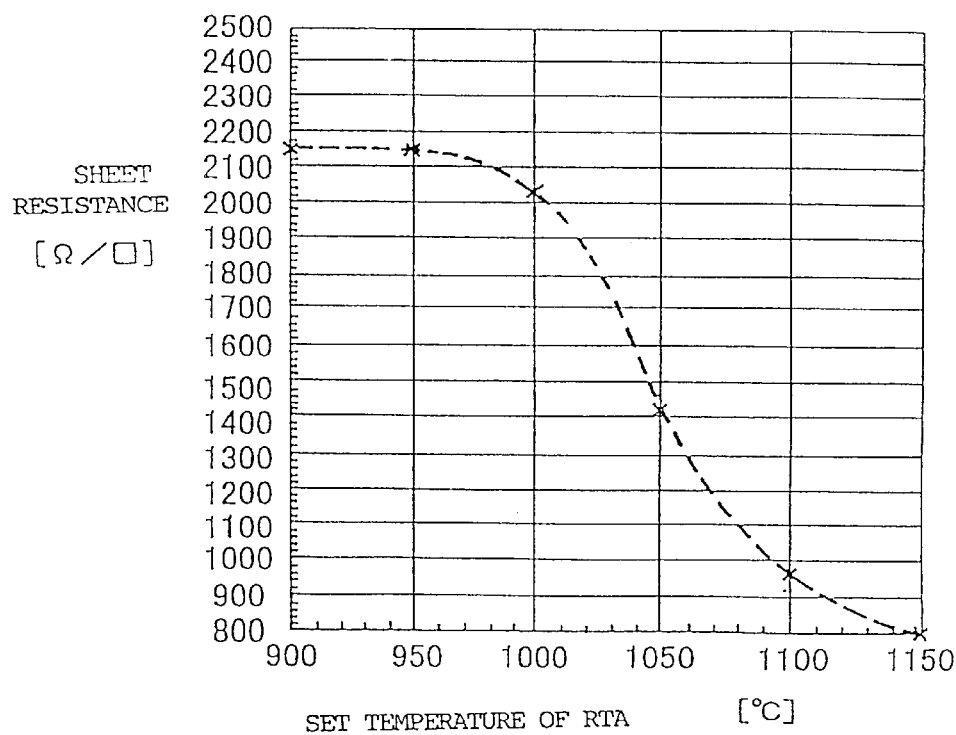
FIG. 5 is a diagram showing the relationship between a sheet resistance of the respective evaluation samples and a set temperature of the RTA.

The temperature dependency of the sheet resistance of each of the evaluation samples at each set temperature are shown in FIG. 5, where the ordinate shows the sheet resistance and the abscissa shows the-set temperature of the RTA.

As shown in FIG. 5, from 900° C. to about 950° C., a nearly constant sheet resistance of 2140 Ω/□ is shown, while when the temperature becomes higher than about 1000° C., the sheet resistance suddenly drops. Then, at 1050° C., the sheet resistance becomes about 1420 Ω/□, at 1100° C., it becomes about 980 Ω/□0 and at 1150° C, it becomes about 8000 Ω/□.

Nextly, in accordance with the above-mentioned sequence explained in FIG. 4, and using a lamp output where the substrate temperature becomes 1050° C. the following evaluation samples are processed in the following manner: the identical lamp output is carried out on all of evaluation samples in which the thicknesses of the oxidized silicon films 63 and 66 of the evaluation sample 61, the thickness of the polycrystal silicon film 77 of the second evaluation sample 71 and the thicknesses of the oxidized silicon films 83 and 86 of the third evaluation sample 81 are altered. That is, continuous heating is carried out by open loop control under the constant irradiation intensity of light.

At that time, the temperatures of the respective evaluation samples are measured by the temperature measuring apparatus 1 (refer to FIG. 1) of the present invention. Nextly, the relationship between the measured values and the sheet resistance will be explained with respect to FIG. 6. Meanwhile, the measurement of the temperatures was carried out twice on the respective evaluation samples.

Figure 6:
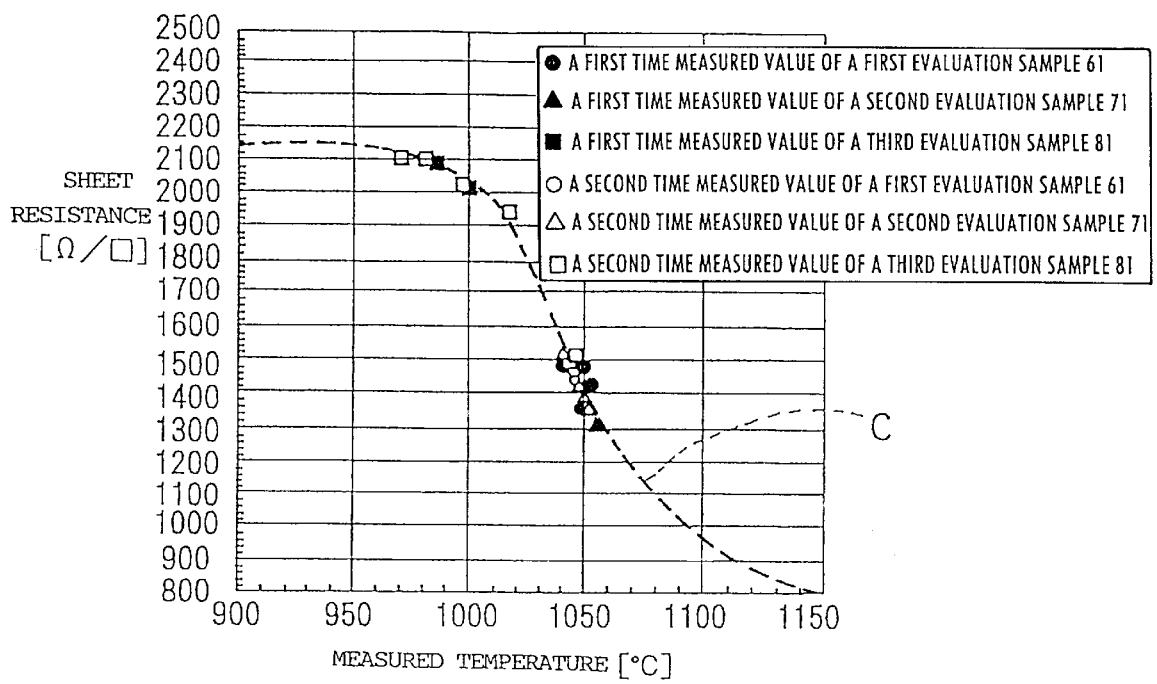
FIG. 6 is a diagram showing the relationship between a measured temperature by the temperature measuring apparatus of the present invention and the sheet resistance.

In FIG. 6, results of the two times measurements are shown together. Also, the ordinate shows the sheet resistance and the abscissa shows the substrate temperature measured by the temperature measuring apparatus 1 under the open loop control.

As shown in FIG. 6, with open loop control heating carried out with the identical light irradiation intensity regardless of the substrates, the sheet resistance (the substrate temperature) changes depending on the differences in thicknesses of films formed on the substrates. The values of the sheet resistance (shown with white blank and black painted circles, triangles and square marks) versus temperatures measured by the temperature measuring apparatus 1 discussed in the above-mentioned FIG. 1, almost match the temperature versus sheet resistance curve C, which is the result of measuring temperature by directly bonding the thermocouple on the substrate, which was explained in FIG. 5.

From this, it can be said that the temperature measuring apparatus 1 of the present invention is capable of carrying out accurate measurements of substrate temperatures with sufficient reproducibility on various substrates which have different substrate structures and different light absorption quantities.

Nextly, the influence of heat capacity and a surface (refer to FIG. 1) covering the temperature measuring portion 12 of the temperature measuring apparatus 1 on measured substrate temperatures was examined.

Figure 7:
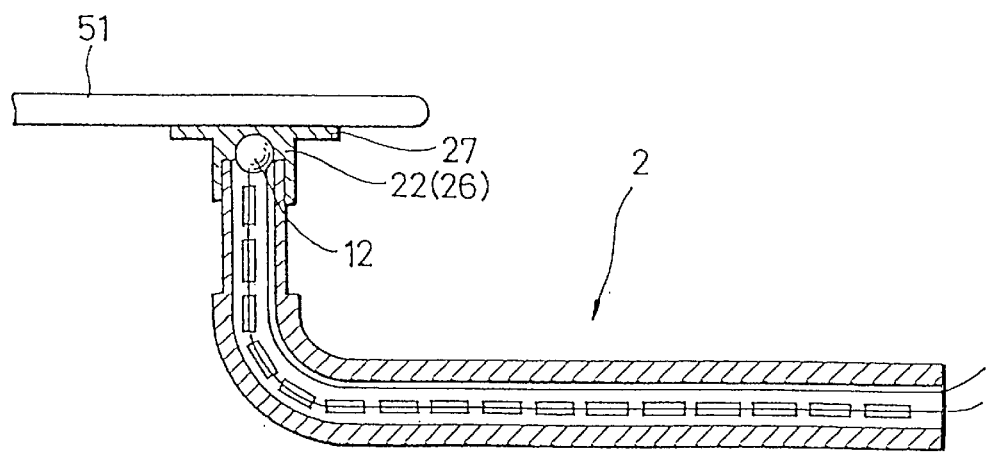
FIG. 7 is a schematic structural cross-sectional diagram of the temperature measuring apparatus of a comparative example.

As shown in FIG. 7, a temperature measuring apparatus 2 is a comparative example in which the heat capacity and the surface area in the temperature measuring apparatus 1, explained in the above-mentioned FIG. 1 are increased by using a, nearly Π-lettered-type cross-sectional piece 26 or the temperature measuring portion covering member 22 of 1 covering the temperature measuring portion 12. That is, what is provided is a collar around the periphery of the temperature measuring portion covering member 22, as depicted in FIG. 1, which extends to and is in contact with the substrate 51.

In the same manner as explained in connection with the above-mentioned FIG. 6, temperatures of respective evaluation samples, as discussed in connection with FIG. 3, are measured by the temperature measuring apparatus 2 which uses the temperature measuring portion covering member 26. The results will be explained in connection with FIG. 8.

Figure 8:
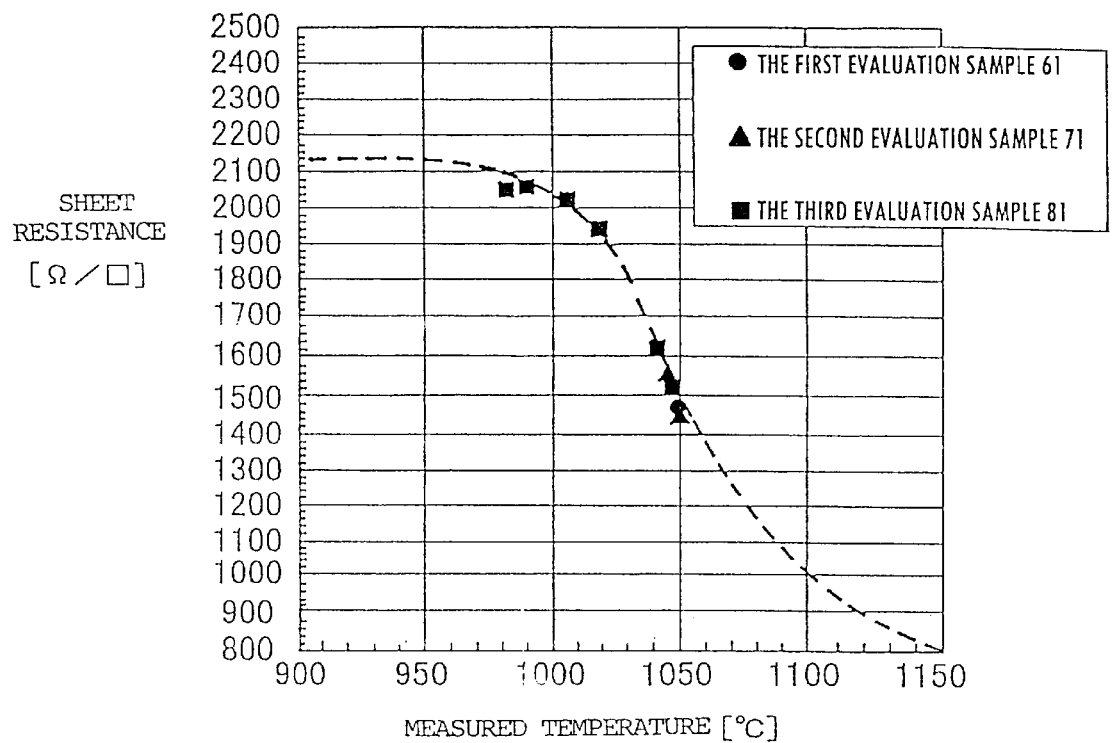
FIG. 8 is a diagram showing relations between the measured temperature by the temperature measuring apparatus of the comparative example and the sheet resistance.

As shown in FIG. 8, where open loop control of heating is carried out with the identical light irradiation intensity regardless of the substrates, the sheet resistance (substrate temperature) changes depending on differences in thickness of films formed on the substrate. The values (shown by black painted circle, triangle, square marks) of the sheet resistance, for the substrates at the measured temperatures, is measured by the temperature measuring apparatus 2 (refer to the above-mentioned FIG. 7), almost match the temperature dependency curve versus sheet resistance depicted in FIG. 5 which is the result of measuring by directly bonding the thermocouple on the substrate.

From this fact, according to an evaluation of when the temperature measuring apparatus of the present invention is used for measuring the temperature under open loop control, wherein the light irradiation intensity is fixed, it is understood that satisfactory measurement of the temperature is possible irrespective of shapes (surface area, heat capacity, contact area with substrate and so on) of the temperature measuring portion covering member 22 covering the temperature measuring portion 12.

Heating at a set temperature of 1050° C. according to the sequence explained in connection with the above-mentioned FIG. 4 is carried out on evaluation samples are altered in terms of the thicknesses of the oxidized silicon films 83 and 86 of the third evaluation sample. This heating method is carried out under closed loop control and uses the temperature measuring apparatus 1 (refer to the above-mentioned FIG. 1), and the temperature measuring apparatus 2 (refer to the above-mentioned FIG. 7). The relationship between sheet resistance of respective evaluation samples and thicknesses of the oxidized silicon films at that time will be shown in FIG. 9. Also, the relationship between the substrate temperatures and the thickness of the oxidized silicon films under the open loop control will be shown in FIG. 10.

Figure 9:
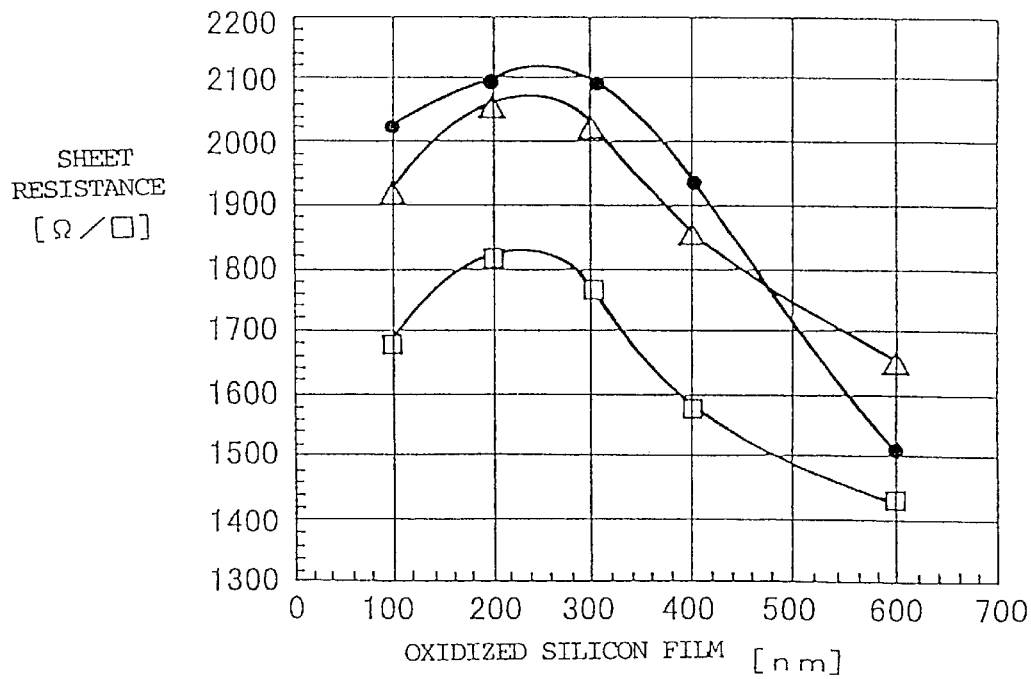
FIG. 9 is a diagram showing the relationship between the sheet resistance of a third evaluation sample and a thickness of an oxidized silicon film.

In FIG. 9, the ordinate shows the sheet resistance and the abscissa shows the thickness of oxidized silicon film.

Figure 10:
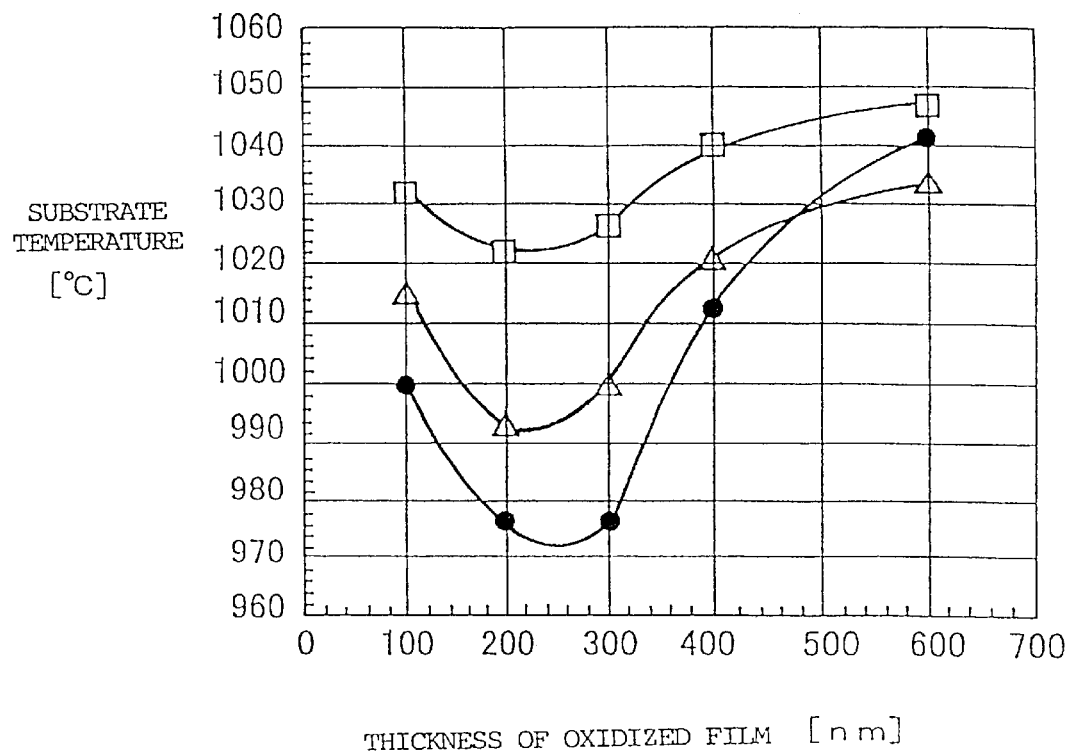
FIG. 10 is a diagram showing the relationship between a substrate temperature of the third evaluation sample and the thickness of the oxidized silicon, film.

In FIG. 10, the ordinate shows the substrate temperature and the abscissa shows the thickness of oxidized silicon film.

In these figures, black painted circle marks show values under open loop control and white blank square marks show values under the closed loop control, using the temperature measuring apparatus 1 (refer to FIG. 1) and white blank triangle marks show values under closed loop control using the temperature measuring apparatus 2 (refer to FIG. 7).

The lamp output on a front surface side as well as a rear-surface side of the substrate is identical.

As shown in FIG. 9 and FIG. 10, dependency of the sheet resistance (substrate temperature) on film thickness, under open loop control is improved by using the temperature measuring apparatuses 1 and 2. Although the above-mentioned temperature measuring apparatuses 1 and 2 can accurately measure the temperature under open loop control, it does not lead to a complete solution of the dependency on film thickness when they are used for the measurement of the substrate temperature under closed loop control. With temperature measuring apparatus 2, it is understood that there is less effect on the improvement of the dependency on the film thickness when compared with the use of temperature measuring apparatus 1. Hereafter, explanations will be made for this result.

Under closed loop control using the temperature measuring apparatuses 1 and 2, heating at a set temperature of 1050° C. was carried out according to the sequence explained in, connection with FIG. 4 with respect to the 3rd evaluation sample 81 ((3) of FIG. 3) wherein the thicknesses of the oxidized silicon films 83 and 86 are altered.

The relationship, at that time, between the ratios of the lamp output, when it is stabilized, and the thicknesses of the oxidized silicon films 83 and 86 will be explained by using FIG. 11. Also, the relationship between the ratios of the lamp output, when it is stabilized, and the converted temperatures of the substrate derived from the sheet resistance will be explained by using FIG. 12. Furthermore, the relationship between the ratios of the lamp output, when it is stabilized, and measured errors which are obtained from differences between the converted temperatures of the substrate and the measured temperatures by the temperature measuring apparatus 1 (refer to FIG. 1) and the temperature measuring apparatus 2 (refer to FIG. 7) will be explained by using FIG. 13.

Meanwhile, the above-mentioned ratios were determined when the lamp output was at 100%.

Figure 11:
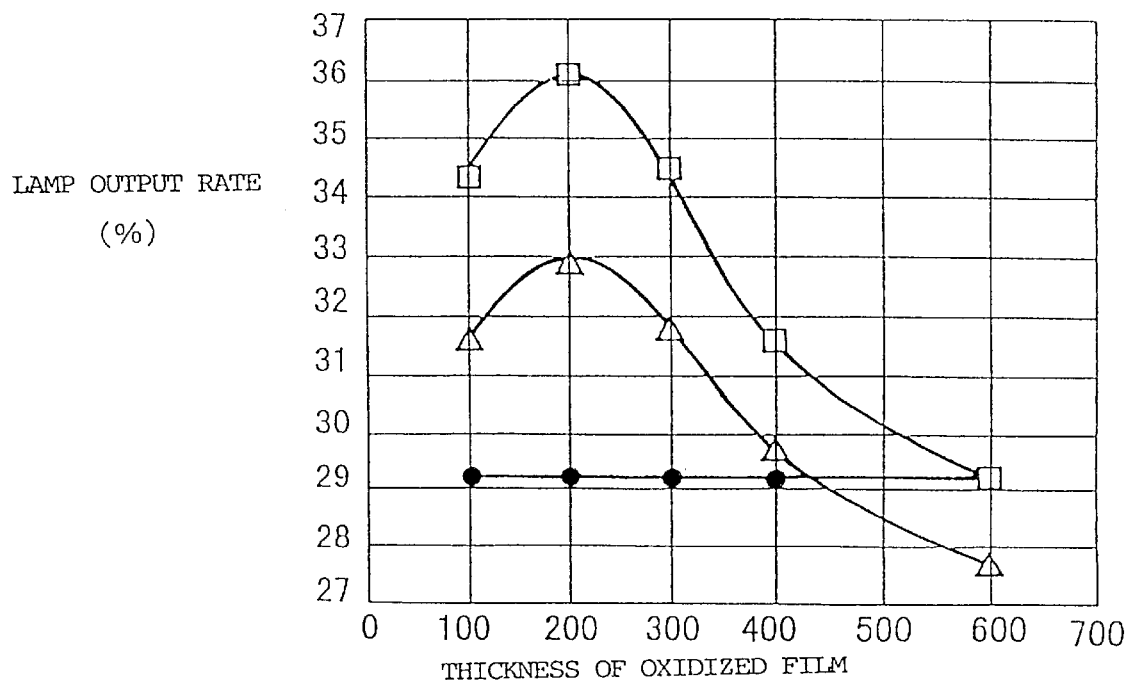
FIG. 11 is a diagram showing the relationship between a lamp output ratio of the third evaluation sample and the thickness of the oxidized silicon film.
Figure 12:
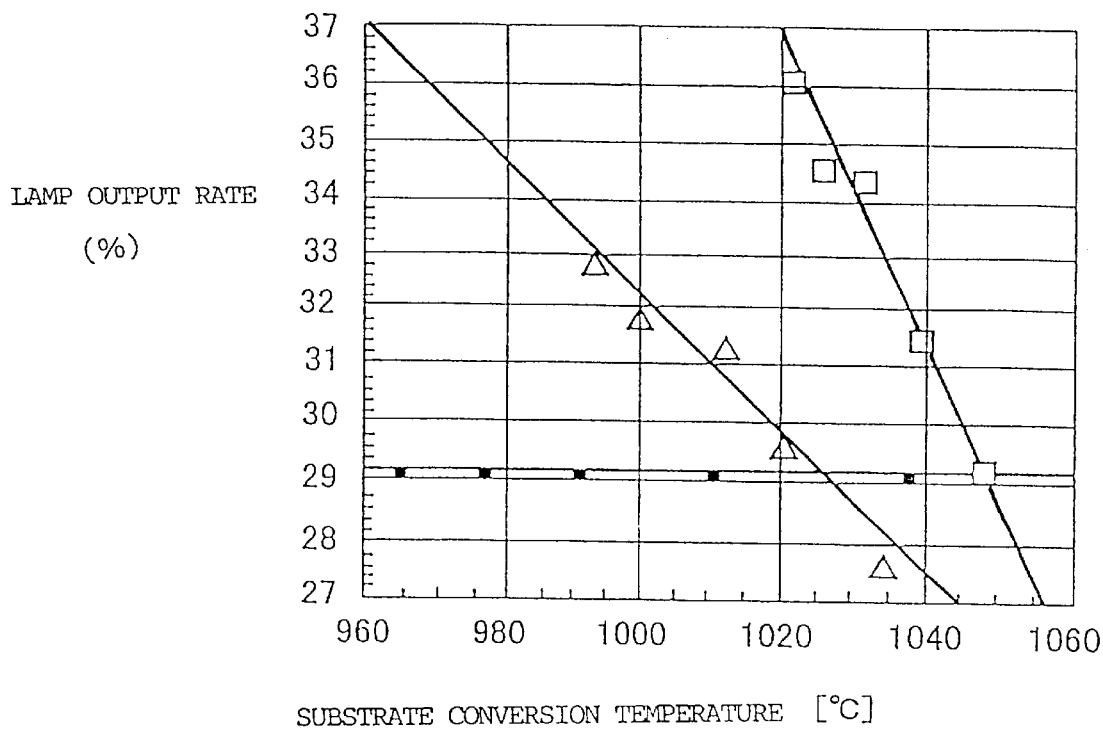
FIG. 12 is a diagram showing the relationship between the lamp output ratio of the third evaluation sample and a substrate conversion temperature.

In FIG. 11, the ordinate shows the ratio of the lamp output and the abscissa shows the thickness of the oxidized silicon film. In FIG. 12, the ordinate shows the ratio of the lamp output and the abscissa shows the substrate temperature converted from the sheet resistance. Further, in FIG. 13, the ordinate shows the ratio of the lamp output and the abscissa shows the measured error which was obtained from the differences between the converted substrate temperatures and the measured temperatures by the temperature measuring apparatus 1 and 2.

In the figures, black painted circle marks show values under the open loop control, white blank square marks show values under the closed loop control using the temperature measuring apparatus 1 and white blank triangle marks show values under the closed loop control using the temperature measuring apparatus 2.

Further, in all cases, the lamp output on the front surface side as well as the rear side of the substrate is identical.

As shown in FIG. 11, under the closed loop control, it is understood that when thickness of the oxidized silicon film is such that the substrate temperature becomes lower, the substrate temperature is corrected by increasing the lamp output.

Also, as shown in FIG. 12, the lamp output changes in a linear form relative to the substrate temperature.

Figure 13:
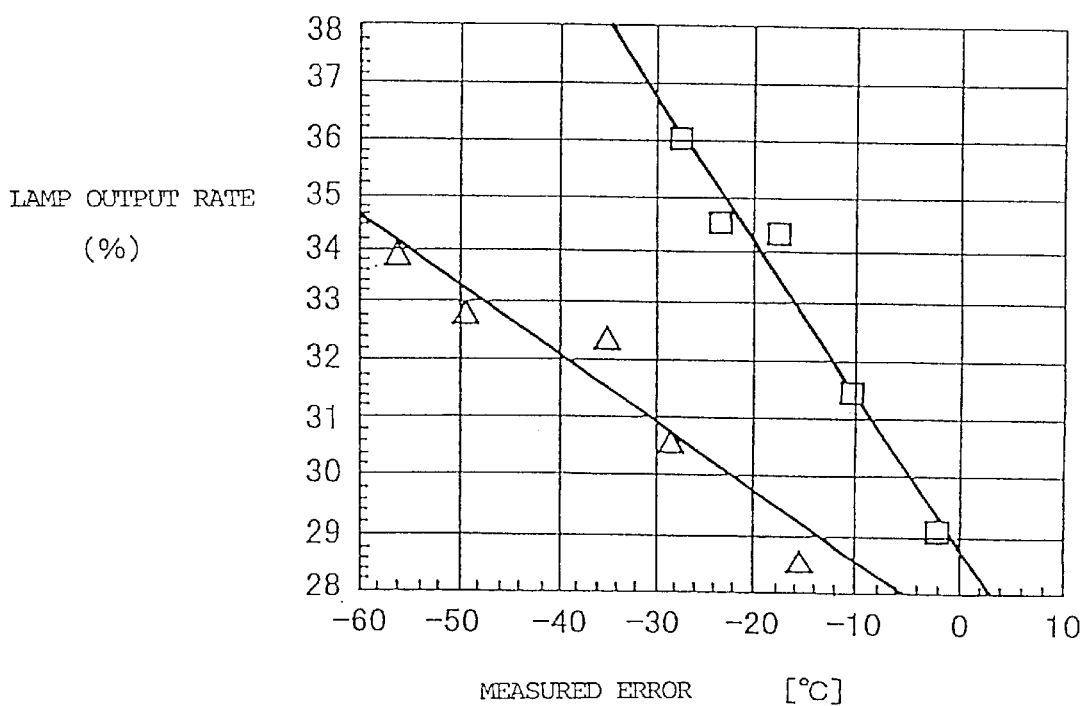
FIG. 13 is a diagram showing the relationship between the lamp output ratio of the third evaluation sample and a measurement error.

However, as shown in FIG. 13, the measured errors by the temperature measuring apparatuses 1 and 2 become larger as the lamp output is increased, and this tendency becomes greater with the temperature measuring apparatus 2 than with the temperature measuring apparatus 1, which proves that the temperature measuring apparatuses 1 and 2 directly absorb the light from the lamp. Therefore, there is a need for a structure to restrain the absorption of light to a minimum by reducing the surface area of the temperature measuring portion covering member 22.

That is, with a structure in which the thermocouple is covered with silicon carbide and further, the contact area is enlarged to facilitate the heat conduction as in a conventional structure, substantial light is absorbed, thereby indicating an impossibility of carrying out precise measurements as under closed loop control.

In FIG. 11 to FIG. 13, problematic points in relation to the measurement of the substrate temperatures by the temperature measuring apparatuses 1 and 2 are shown by using measured results of the third evaluation sample 81 [refer to (3) in FIG. 3] wherein the quantity of the light absorbed by the substrate changes greatly depending on the thickness of the oxidized silicon film.

However, in a practically managed manufacturing process of a semiconductor device, fluctuation in the light absorption (substrate temperature) due to dispersion with variations of film thickness and film quality is far smaller than the above-mentioned set film thickness condition of oxidized silicon film. Therefore, it is possible to adequately solve the dependency of the sheet resistance (substrate temperature) on film thickness, under open loop control, by closed loop control which uses the temperature measuring apparatus 1.

As set forth, in order to carry out highly precise measurement under close loop control, it is necessary to make covering member 22, covering the temperature measuring portion 12, as small as possible and restrain the absorption of the light. This leads to, it is ascertained, the simultaneous lowering-of the heat capacity of the temperature measuring portion covering member 22 and improvement in heat responsiveness.

In this manner, the present invention constitutes the covering member 21 which includes the temperature measuring portion covering member 22 which has excellent heat conductivity and the lined portion covering member 23 which absorbs less radiation (in other words, excellent in light transmission factor). Hence, unlike the temperature measuring apparatus wherein the covering member is made up of one kind of material as in the conventional technology, it becomes possible, as mentioned above, to accurately measure the temperature of the substrate 51 (the evaluation samples 61, 71 and 81).

With the above-mentioned temperature measuring apparatus 1, the temperature measuring portion covering member 22 is made of silicon carbide, or another material having excellent heat conductivity. It may be possible that the temperature measuring portion covering member is made of, for example, aluminum nitride, silicide (for example, molybdenum silicide, titanium silicide, cobalt silicide, and the like) or alumina. For example, in a case of being made of alumina, because the reflection factor on the surface of the temperature measuring portion covering member 22 is high, the irradiated light for heating—the substrate 51 is reflected. For this reason, the temperature measuring portion covering member 22 is rarely heated by the irradiated light. As a result, the measuring errors due to the light absorption by the temperature measuring portion covering member 22 is restrained, thereby making it possible to carry out the measurement with high precision. Also, similar to the silicon carbide, the above-mentioned temperature measuring portion covering member 22 never contaminates the substrate 51 upon heat treatment.

In the above-mentioned first embodiment, the wire portion covering member 23 is made of quartz, but the second embodiment, (the wire portion covering member) is possibly made of a material which reflects the irradiated light heating the substrate 51. For example, the wire portion covering member 23 is made of alumina.

In a structure like this, when subjected to the light irradiation, the wire portion covering member 23 for covering the conductor wires of the thermocouple 11 reflects the light. As a result, because there is scarcely any rise in the temperature of the lined portion covering member 23 due to the light irradiation, almost no change in the value of the measured temperature of the thermocouple 11 due to aluminum nitride, silicide (for example, molybdenum silicide, titanium silicide, cobalt silicide, and the like) or alumina. For example, in a case of being made of alumina, because the reflection factor on the surface of the temperature measuring portion covering member 22 is high, the irradiated light for heating the substrate 51 is reflected. For this reason, the temperature measuring portion covering member 22 is rarely heated by the irradiated light. As a result, the measuring errors due to the light absorption-by the temperature measuring portion covering member 22 is restrained, thereby making it possible to carry out the measurement with high precision. Also, similar to the silicon carbide, the above-mentioned temperature measuring portion covering member 22 does never contaminate the substrate 51 upon heat treatment.

The problem of measuring errors caused by the light absorption when the substrate temperature is measured can be solved by using the temperature measuring apparatus 1 which was explained in the above-mentioned first embodiment. However, what is posed as a problem for a temperature measuring apparatus for measuring the temperature while being in-contact with the substrate, like the temperature measuring apparatus 1, is the stability of the contact between the substrate and the temperature measuring portion of the temperature measuring apparatus. This means that because of a change in a contact area between the temperature measuring apparatus and the substrate due to a warp of the substrate, a surface state of the substrate and the like, a quantity of conducted heat from the substrate varies, resulting in the emergence of a deterioration in measuring accuracy. Specifically, in a case where the contact surface is made flat in order to make a contact area wider, because of a slipping off of a contact angle due to a mere warp of the substrate, unevenness of the surface and the like, the contact area varies widely. A temperature measuring apparatus for improving reproducibility of this contact state will be explained with a schematic structural cross-sectional diagram in FIG. 14 as a third embodiment.

Figure 14:
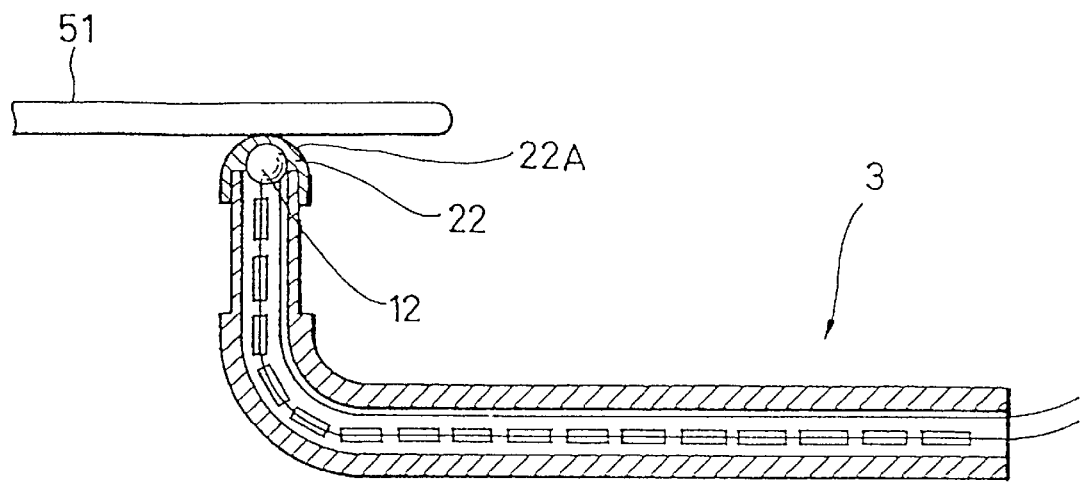
FIG. 14 is a schematic structural cross-sectional diagram of a third embodiment in connection with the temperature measuring apparatus.

As shown in FIG. 14, a temperature measuring apparatus 3 has the same general structure as that of the temperature measuring apparatus 1 explained in the in connection with above mentioned FIG. 1, wherein a contact surface 22A of the temperature measuring portion covering member 22 fixed on the temperature measuring portion 12, which comes in contact with the substrate 51, is formed into a convex curve surface.

As the temperature measuring apparatus 3 with a structure according to the above-mentioned 3rd embodiment has the contact surface 22A formed into the convex curve surface, the contact with the substrate 51 becomes a so-called point contact. For that reason, even if the contact surface of the substrate 51 is warped, its surface is uneven, or the contact surface 22A comes in contact with the substrate 51 in a tilting state, the contact state of the point contact does not change. Therefore, it becomes possible to always maintain a constant state of contact (for example, a contact angle, a contact area and the like). As a result, because the measuring errors due to a contact state are reduced, stable measurement of the substrate temperature can be realized.

Nextly, a fourth embodiment will be explained with reference to a schematic cross-sectional view of FIG. 15.

Figure 15:
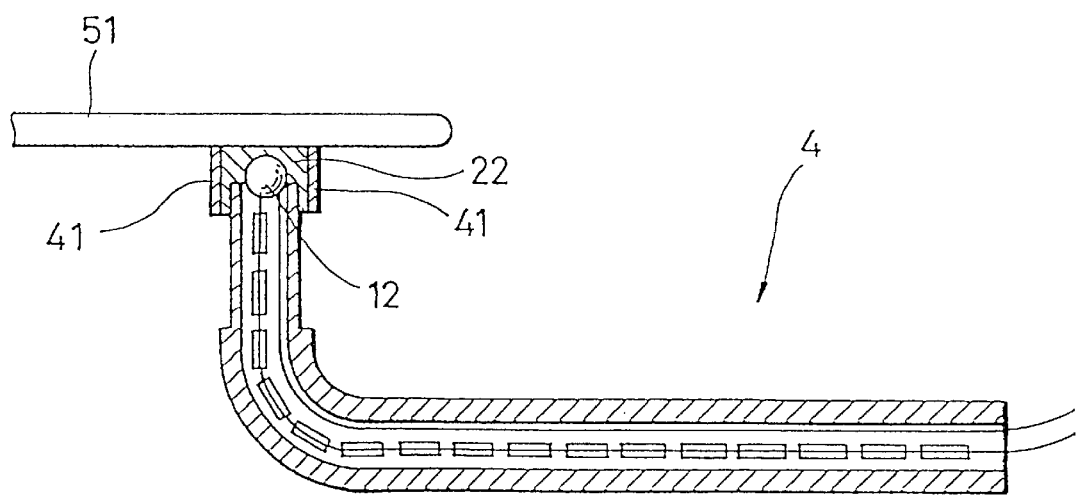
FIG. 15 is a schematic structural cross-sectional diagram of a forth embodiment in connection with the temperature measuring apparatus.

As shown in FIG. 15, a temperature measuring apparatus 4 is such that a reflecting covering layer 41 for reflecting the light irradiated on the substrate 51 is formed on an outer periphery of the temperature measuring portion covering member 22, fixed on the temperature measuring portion 12, of the temperature measuring apparatus 1.

Because the above-mentioned temperature measuring apparatus 4 has the reflecting covering layer 41 for reflecting the light irradiated on the substrate 51, the layer being formed on the outer periphery of the temperature measuring portion covering member 22, the light is not directly irradiated on the temperature measuring portion covering member 22. As a result, the temperature measuring portion covering member 22 is not directly heated by the irradiated light, thereby making it possible to implement an improvement in the accuracy of measurement of the temperature of the substrate 51.

Nextly, a fifth embodiment will be explained with reference to a schematic cross-sectional view of FIG. 16.

Figure 16:
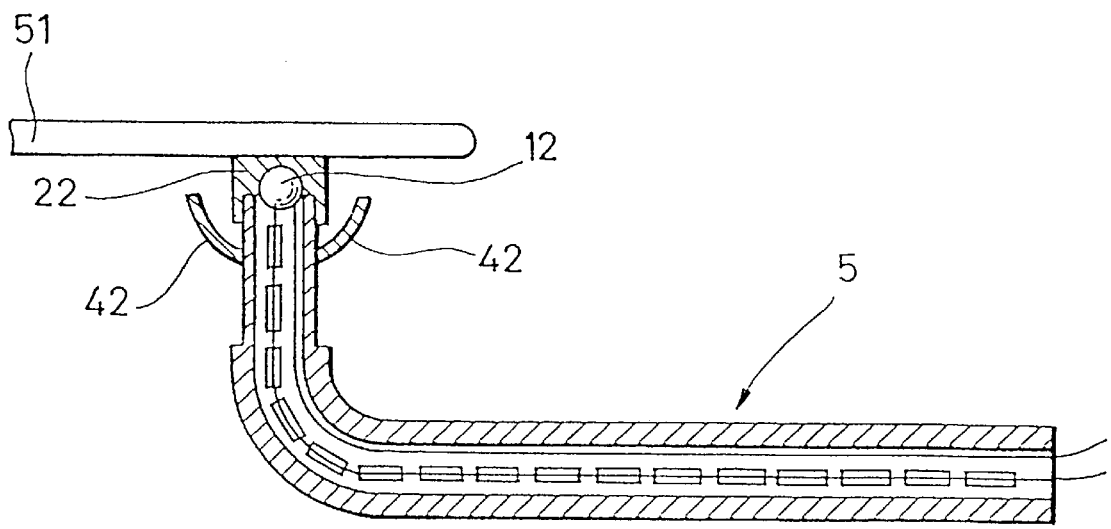
FIG. 16 is a schematic structural cross-sectional diagram of a fifth embodiment in connection with the temperature measuring apparatus.

As shown in FIG. 16, a temperature measuring apparatus 5 is such that a light shielding plate 42, for shielding the irradiated light, is formed on an optical path of the light irradiated on the temperature measuring portion covering member 22 and is fixed on the temperature measuring portion 12 of the temperature measuring apparatus 1, as described in the above mentioned first embodiment, and is also near the temperature measuring portion covering member 22.

The above-mentioned light shielding plate 42 is preferably made of material such as alumina, and the like which reflect light.

As the above-mentioned temperature measuring apparatus 5 has the light shielding plate 42 formed near the above-mentioned temperature measuring portion covering member 22 for shielding the light irradiated on the rear side of the substrate 51, the light is not directly irradiated on the temperature measuring portion covering member 22. As a result, the temperature measuring portion covering member 22 is not directly heated by the irradiated light, thereby making it possible to implement an improvement in of the accuracy of measurement of the temperature of the substrate 51.

Nextly, examples of methods for measuring the substrate temperature by using any of the above-mentioned temperature measuring apparatus 1 through 5, explained as follows.

Like the one explained in connection with FIG. 2, for example, a light irradiation type heating method device 101 is installed with, for example, the temperature measuring apparatus 1. First of all, the substrate 51 to be subjected to heat treatment is inserted into the inside of the tube 112 of the light irradiation type heating method device 101, and is supported by the tip portion (that is, the temperature measuring portion 12 through the temperature measuring portion covering member 22 explained in connection with the above-mentioned FIG. 1) of the temperature measuring apparatus 1 arranged on the tray 117 and by the substrate supporting portion 118 as well. Then, the heating halogen lamp 113 provided around the periphery of the tube 112 is made to emit light, and heating method of the substrate 51 is carried out by irradiating the light on the substrate 51. At this time, the temperature of the substrate 51 is measured by the above mentioned temperature measuring apparatus 1.

According to the above-mentioned method for measuring the temperature of the substrate, by using the temperature measuring apparatus 1 in which the thermocouple 11 is covered with the covering member 21, and of the covering member 22, as the temperature measuring portion covering member 22 covering the temperature measuring portion 12 of the thermocouple 11 is made of a material having high heat conductivity, the temperature of the substrate 51 is measured, so that the temperature of the substrate 51 conducts to the temperature measuring portion 12 thanks to the temperature measuring portion covering member 22 being made of the high heat conductive material. For that reason, in spite of measuring the temperature through the covering member 21, it becomes possible to accurately measure the temperature of the substrate 51. Also, because the covering member in the other portion excluding the temperature measuring portion covering member 22, that is, the wire portion covering member 23, is made of a material having a high light transmission factor (or a material with a high light reflection factor), the wire portion covering member 23, when subjected to the light irradiation in the midst of measuring, rarely absorbs light. For that reason, as an increase in the temperature of the wire covering member 23 due to the light irradiation becomes almost nothing, any change in the temperature measured values by the temperature measuring apparatus 1 due to heat absorption by the wire covering member 23 as well as any change in the temperature measured values due to radiation from the substrate 51, seldom occur.

Therefore, it becomes possible for the above mentioned temperature measuring apparatus 1 to measure the temperature of the substrate 51 with high accuracy at a time of heat treatment.

In the above-mentioned explanation, the temperature measuring apparatus 1 was used, but by using other temperature measuring apparatus 2 to the temperature measuring apparatus 5, it similarly becomes possible to measure the-temperature of the substrate 51 with high accuracy in the midst of the heating method.

Figure 17:
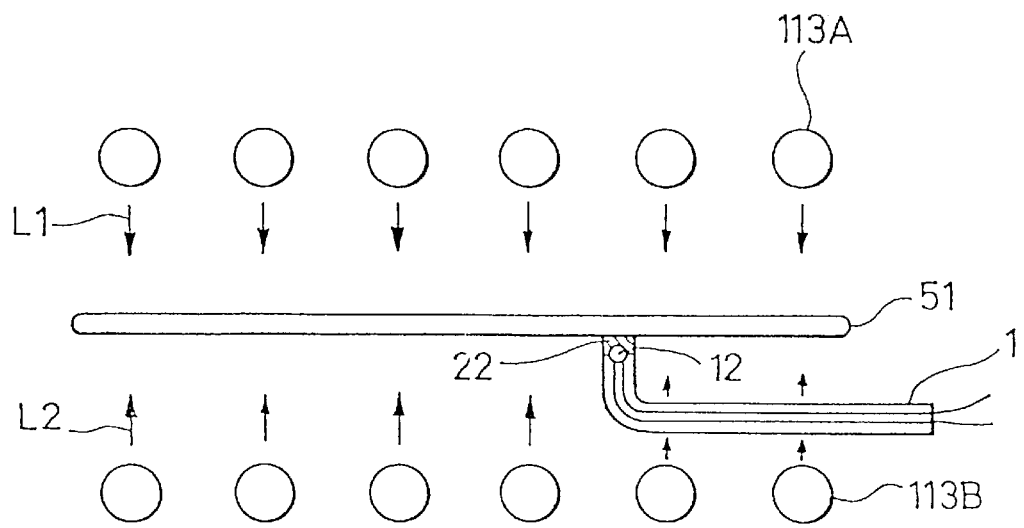
FIG. 17 is an explanatory diagram in connection with a substrate heating method according to the present invention.

Nextly, one example of a heating method for the substrate, carrying out high precision measurements of the temperature by reducing the quantity of light irradiation on the temperature measuring apparatus, will be explained with reference to FIG. 17.

The irradiation intensity of light L1 is irradiated on the front surface of the substrate 51 located opposite the rear surface of the substrate 51 i.e., on the side with which the temperature measuring portion 12 of the temperature measuring apparatus 1 for measuring the temperature of the substrate 51 comes in contact with the substrate. The light intensity of L1 is relatively raised higher than the irradiation intensity of light L2, irradiated on the rear surface of the substrate 51.

That is, by raising the radiation intensity of a lamp 113A on the front surface side of the substrate 51 higher relative to the radiation intensity of a lamp 113B on the rear surface side of the substrate 51, the quantity of the irradiation light on the temperature measuring portion covering member 22 can be reduced and hence, the improvement of the measuring accuracy of the temperature measuring apparatus 1 can be enhanced.

Nextly, as an example, the relationship between ratios of the lamp output compared with when the lamp output is 100% and the measured errors of the substrate temperatures will be explained in connection with FIG. 18. Meanwhile, the ratio between the lamp output on the front surface side of the substrate and the lamp output on the rear surface side of the substrate is set to 2:1.

Figure 18:
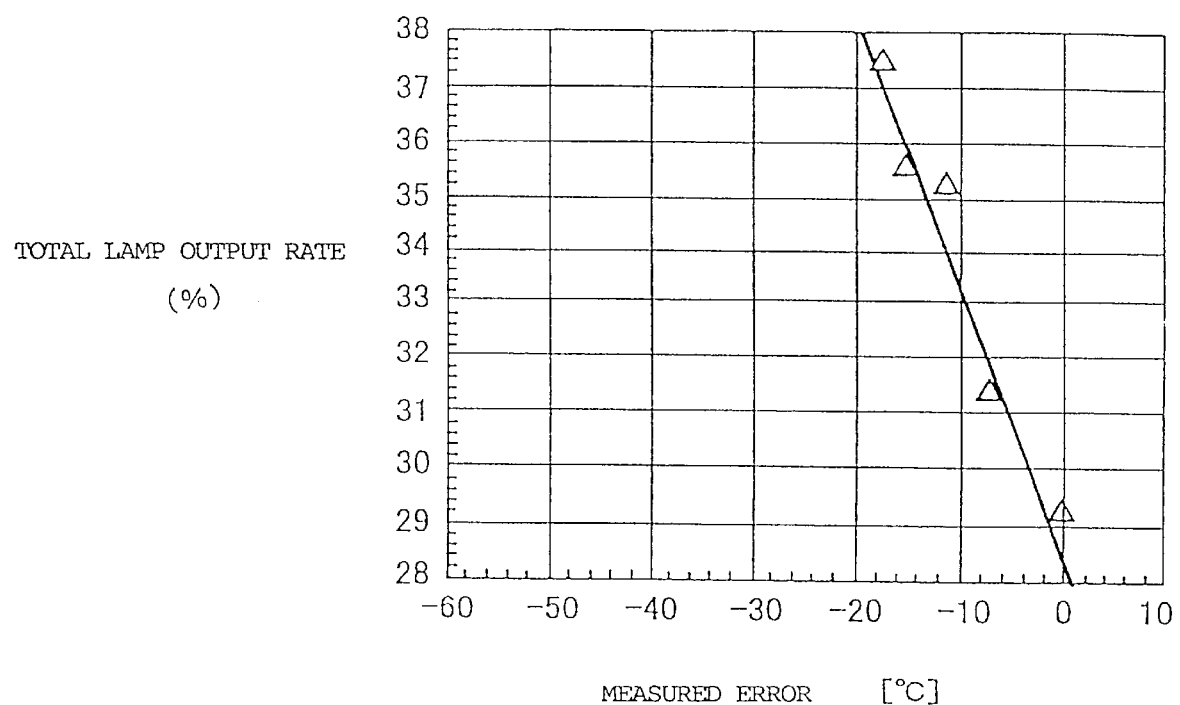
FIG. 18 is a diagram showing the relationship between the lamp output ratio of the third evaluation sample and the measurement error.

In FIG. 18, the ordinate shows the ratios of the lamp output compared with when the lamp output is 100%, and the abscissa shows the measured error which is obtained from the difference between the substrate conversion temperatures and the measured temperatures by the temperature measuring apparatus 1. In the figure, white blank triangle marks show values under the closed loop control using the temperature measuring apparatus 1.

As shown in FIG. 18, the measured error by the temperature measuring apparatus 1 becomes larger as the lamp output is raised, but an increment thereof is small. As the results shown in FIG. 18 are from an experiment on a substrate of 5 inches in diameter, when compared with an experiment using a substrate of a large diameter such as 8 inches, the light irradiated from the lamp on the front surface side of the substrate tends to diffract to reach the rear surface side of the substrate. Therefore, the effects resulting from raising the, radiation intensity on the front surface side of the substrate do not appear so much. However, compared with the time when the ratio of the lamp output was 1:1 as shown in the above-mentioned FIG. 13, it is understood that the measured errors by the temperature measuring apparatus 1, which depend on the lamp output have been improved. This proves that the quantity of light from the lamp, that the temperature measuring apparatus 1 directly absorbs, is reduced. Therefore, it is understood that measurements with high accuracy can be carried out by reducing the light intensity irradiated on the surface of the substrate on the side where the temperature measuring apparatus is provided.

What is claimed is:

1. In a temperature measuring apparatus for a substrate provided with a temperature measuring means and a covering member for covering said temperature measuring means in which a temperature measuring portion of said temperature measuring means is made to be in contact with a substrate through said covering member to measure a temperature of said substrate heated by irradiation of light, the temperature measuring apparatus for a substrate being characterized in that said covering member having a portion covering said temperature measuring portion, said portion being made of a material with a high heat conductivity, and said covering member another portion, excluding the covering member which is made of said material with a high heat conductivity, said another portion being made of a material with a high light transmission factor.

2. In a temperature measuring apparatus for a substrate provided with a temperature measuring means and a covering member for covering said temperature measuring means in which a temperature measuring portion of said temperature measuring means is made to be in contact with a substrate through said covering member to measure a temperature of said substrate heated by irradiation of light, the temperature measuring apparatus for a substrate being characterized in that said covering member, having a portion covering said temperature measuring portion, said portion being made of a material with a high heat conductivity, and said covering member, having another portion, excluding the covering member which is made of said material with a high heat conductivity, said another portion being made of a material with a high light reflection factor.

3. A temperature measuring apparatus for a substrate as claimed in claim 1, being characterized in that a surface of said covering member which comes in contact with said substrate is formed into a convex curve surface.

4. A temperature measuring apparatus for a substrate as claimed in claim 2, being characterized in that a surface of said covering member which comes in contact with said substrate is formed into a convex curve surface.

5. A temperature measuring apparatus for a substrate as claimed in claim 1, being characterized in that said covering member made of the material with a high heat conductivity is made of silicon carbide, aluminum nitride, silicide or alumina.

6. A temperature measuring apparatus for a substrate as claimed in claim 2, being characterized in that said covering member made of the material with a high heat conductivity is made of silicon carbide, aluminum nitride, silicide or alumina.

7. A temperature measuring apparatus for a substrate as claimed in claim 1, being characterized in that on an outer periphery of said covering member made of the material with a high heat conductivity, a reflecting covering layer made of a material with a high reflection factor relative to said light is formed.

8. A temperature measuring apparatus for a substrate as claimed in claim 2, being characterized in that on an outer periphery of said covering member made of the material with a high heat conductivity, a reflecting covering layer made of a material with a high reflection factor relative to said light is formed.

9. A temperature measuring apparatus for a substrate as claimed in claim 1, being characterized in that on an optical path of said light irradiated on the covering member made of said material with a high heat conductivity and near the covering member made of said material with a high heat conductivity, a light shielding plate for shielding said light is provided.

10. A temperature measuring apparatus for a substrate as claimed in claim 2, being characterized in that on an optical path of said light irradiated on the covering member made of said material with a high heat conductivity and near the covering member made of said material with a high heat conductivity, a light shielding plate for shielding said light is provided.

11. In a temperature measuring method for a substrate provided with a temperature measuring means and a covering member for covering said temperature measuring means in which a temperature measuring portion of said temperature measuring means is made to be in contact with a substrate through said covering member to measure a temperature of said substrate heated by irradiation of light, the temperature measuring method for a substrate being characterized in that a temperature of said substrate is measured by using a temperature measuring apparatus which said covering member, having a portion covering said temperature measuring portion, said portion being made of a material with a high heat conductivity, and said covering member, having another portion, excluding the covering member which is made of said material with a high heat conductivity, said another portion being made of a material with a high light reflection factor.

12. In a temperature measuring method for a substrate provided with a temperature measuring means and a covering member for covering said temperature measuring means in which a temperature measuring portion of said temperature measuring means is made to be in contact with a substrate through said covering member to measure a temperature of said substrate heated by irradiation of light, the temperature measuring method for a substrate being characterized in that a temperature of said substrate is measured by using a temperature measuring apparatus which said covering member, having a portion covering said temperature measuring portion, said another portion being made of a material with a high heat conductivity, and said covering member, having another portion, excluding the covering member which is made of said material with a high heat conductivity, said another portion being made of a material with a high light transmission factor.

13. A heating method for heating a substrate by irradiation of light, the heating method being characterized in that the irradiation of a light irradiated on a surface of the substrate on an opposite side from a surface of said substrate to which a temperature measuring portion of a temperature measuring apparatus for measuring a temperature of said substrate comes in contact, is raised higher than the irradiation intensity of a light irradiated on the surface of the substrate on the side with which said temperature measuring portion comes in contact.

14. A heating method apparatus being for a member, being characterized by comprising;

a heating light source for heating by way of irradiation of light;

a member to be heated irradiated by the light from said heating light source;

a temperature heating portion for measuring a temperature of said member to be heated;

a first temperature measuring portion covering member which is provided at one end of said temperature measuring portion and made of a material with a high heat conductivity; and a second temperature measuring portion covering member covering a periphery of said temperature measuring portion and made of a material with a high light transmission factor.

15. A heating method for a member, being characterized by comprising:

a heating light source for heating by way of irradiation of light;

a member to be irradiated by the light from said heating light source;

a temperature measuring portion for measuring a temperature of said member to be heated;

a first temperature measuring portion covering member which is provided at one end of said temperature measuring portion and made of a material with a high heat conductivity; and a second temperature measuring portion covering member covering a periphery of said temperature measuring portion and made of a material with a high light reflection factor.

16. A heating method apparatus for the member as claimed in claim 14, being characterized in that said first temperature measuring portion covering member is made to be in contact with said member to be heated for measuring a temperature thereof.

17. A heating method apparatus for a member as claimed in claim 15, being characterized in that said first temperature measuring portion covering member is made to be in contact with said member to be heated for measuring a temperature thereof.

18. A heating method apparatus for a member as claimed in claim 16, being characterized in that said member to be heated is a semiconductor substrate.

19. A heating method apparatus for a member as claimed in claim 17, being characterized in that said member to be heated is a semiconductor substrate.

20. A heating method apparatus for a member as claimed in claim 16, being characterized in that a surface of said first temperature measuring portion covering member which comes in contact with said member to be heated is formed into a convex curve surface.

21. A heating method apparatus for a member as claimed in claim 17, being characterized in that a surface of said first temperature measuring portion covering member which comes in contact with said member to be heated is formed into a convex curve surface.

22. A temperature measuring device for measuring the temperature of an irradiated substrate:

said temperature measuring device having sensor means responsive to temperature and non-sensor means, said sensor means being connected to said non-sensor means;

said temperature measuring device also having covering means for covering said sensor means and said non-sensor means;

said covering means having a high heat conductivity first portion covering said sensor means and substantially coextensive therewith and a high light transmission factor second portion covering said non-sensor means and substantially coextensive therewith; and, said temperature measuring device having further means for directly contacting said substrate.

23. The temperature measuring device of claim 22 wherein said further means for directly contacting said substrate includes said sensor means and said high heat conductivity first portion of said covering means, said sensor means contacting said substrate through said covering means first portion.

24. The temperature measuring device of claim 23 wherein said covering means first portion has a convex curve shape where it contacts said substrate.

25. The temperature measuring device of claim 23 wherein said covering means first portion further includes radiation reflecting means.

26. The temperature measuring device of claim 23 wherein said covering means further includes light shielding means connected to, and extending away from, said covering means.

27. The temperature measuring apparatus of claim 1 wherein said covering member portion covering said temperature measuring portion is made of a material with higher heat conductivity and a lesser light transmission factor than the material of said another portion.

28. The temperature measuring apparatus of claim 2 wherein said covering member portion covering said temperature measuring portion is made of a material with higher heat conductivity and a lesser light reflection factor than the material of said another portion.

* * * * *